United States Patent [19]

Copeland, III

[11] 4,300,107
[45] Nov. 10, 1981

[54] TRAP DOPED LASER COMBINED WITH PHOTODETECTOR

[75] Inventor: John A. Copeland, III, Fair Haven, N.J.

[73] Assignee: Bell Telephone Laboratories, Incorporated, Murray Hill, N.J.

[21] Appl. No.: 58,470

[22] Filed: Jul. 18, 1979

[51] Int. Cl.³ .............................................. H01S 3/19
[52] U.S. Cl. ................................ 331/94.5 H; 357/16; 357/17; 357/19; 357/91
[58] Field of Search ............... 331/94.5 H; 357/16–18, 357/19, 61, 91, 60; 307/312

[56] References Cited

U.S. PATENT DOCUMENTS

| | | | |
|---|---|---|---|
| 3,654,497 | 4/1972 | Dyment et al. | 307/312 |
| 3,758,875 | 9/1973 | Hayashi | 331/94.5 H |
| 3,891,993 | 6/1975 | Beneking | 357/19 |
| 3,893,044 | 7/1975 | Dunke et al. | 331/94.5 H |
| 4,055,815 | 10/1977 | Smith | 331/94.5 H |
| 4,065,729 | 12/1977 | Gover | 331/94.5 H |

OTHER PUBLICATIONS

Kato, "Microscale degradation in (GaAl)As Double-Heterostructure Diode Lasers", *APL*, vol. 31, No. 9, Nov. 1, 1977, pp. 588–590.

Paoli, "Saturation Absorption Effects in the Self-Pulsing (AlGa)As Junction Laser", *APL*, 34 (10), May 15, 1979, pp. 652–655.

*Primary Examiner*—James W. Davie
*Attorney, Agent, or Firm*—Daniel D. Dubosky

[57] ABSTRACT

A semiconductor laser is disclosed wherein the active region has been doped with deep-level electron traps either by proton bombarding the active region or by doping with an impurity, such as oxygen, iron, or chromium. The density of traps is such that an optical absorption parameter of greater than 30 cm$^{-1}$ is achieved. This laser, when combined with an ordinary photodiode, exhibits overall optical gain thereby permitting an array of optical logic circuits.

8 Claims, 5 Drawing Figures

TRAP-DOPED LASER

TRAP DOPED LASER COMBINED WITH PHOTODETECTOR

BACKGROUND OF THE INVENTION

This invention relates to semiconductor lasers and, more particularly, to heterostructure semiconductor lasers that are doped with deep-level traps.

Ordinary heterostructure semiconductor lasers generally exhibit an efficiency in terms of elecrical input versus optical output of about 20 percent. Heterostructure semiconductor lasers of the type under consideration herein are well known to those skilled in the art. See, for example, U.S. Pat. No. 3,758,875 issued on Sept. 11, 1973 to I. Hayashi and U.S. Pat. No. 3,893,044 issued on July 1, 1975 to W. P. Dumke. Ordinary photodetectors without avalanche gain exhibit an efficiency of about 80 percent. It is therefore impossible to combine an ordinary photodiode with a semiconductor laser and achieve a combination that exhibits optical gain. In an effort to achieve optical gain, some have proposed that an avalanche detector be combined with a laser thereby creating optical circuits that may be connected in tandem. Avalanche photodiodes, however, require a high electrical bias voltage and it is therefore difficult to combine this type of photodetector into logic circuits exhibiting AND and OR functions. it would be highly advantageous to create a semiconductor laser whose efficiency is greater than one, thereby permitting the creation of optical logic arrays.

Some studies have been conducted to determine the effect of deep-level traps in the active region of a double heterostructure semiconductor laser. See, for example, the article entitled "Microscale Degradation in (GaAl) Double-Heterostructure Diode Lasers" by D. Kato, *Applied Physics Letters*, Vol. 31, No. 9, November 1977, pp. 588-590. As pointed out in the Kato article, these deep-level traps can result in self-sustained pulsations. As also pointed out in the Kato article, the deep-level traps can be formed or developed by crystal imperfections and/or the presence of added impurities.

SUMMARY OF THE INVENTION

This invention is based on the discovery that a semiconductor laser with deep-level traps exhibits a step function increase in the light output developed when the current exceeds a threshold level, providing the traps created in the active region with a large enough density such that the optical absorption parameter for the active region exceeds 30 cm$^{-1}$. By biasing this type of semiconductor laser at a current level slightly below the threshold level, an electrical current pulse can create an optical pulse with greater energy than is present in the electrical pulse. As a result, this type of semiconductor laser may be combined with an ordinary photodiode to produce an optical circuit that exhibits optical gain. More than one diode may be combined to provide the logic AND and OR functions thereby providing the basic element to be used in creating an array of optical logic circuits. The deep-level traps may be created in the active region by proton bombarding the active region of the laser or by doping the active region of a III-V semiconductor laser with an impurity, such as oxygen, iron or chromium.

DETAILED DESCRIPTION

Figure 1:
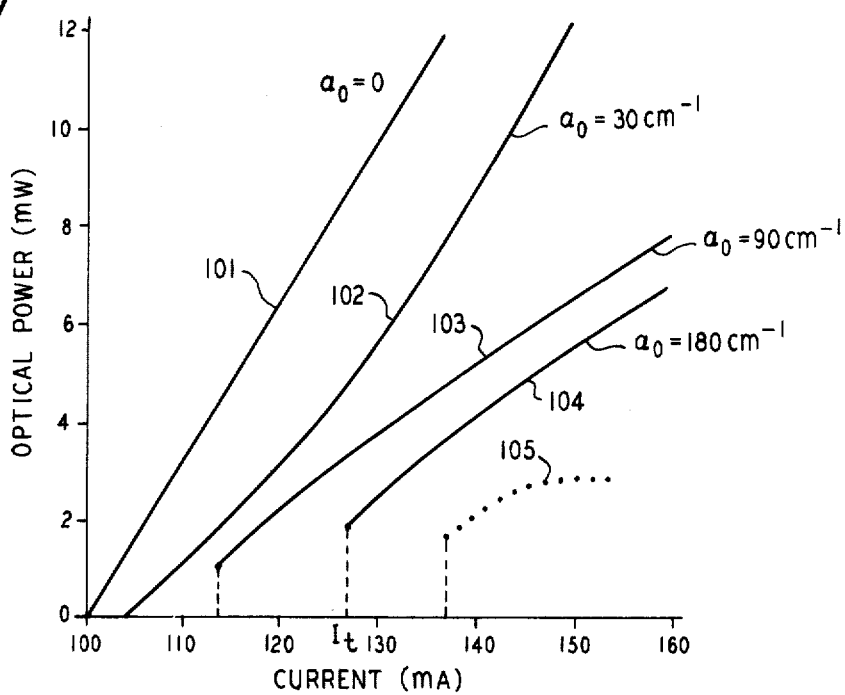
FIG. 1 is a graphic representation of output power versus pump current for different densities of deep-level traps in a III-V semiconductor laser using aluminum gallium arsenide.

The above-identified U.S. Pats. Nos. 3,758,875 and 3, 893,044 are incorporated herein by reference to provide examples of devices to which the present invention applies.

The term optical absorption parameter as used in the following detailed description is the standard parameter used in the art. See, for example, the book "Optical Processes in Semiconductors" by J. I. Pankove (Dover Publications, Inc., New York, 1971) and the article by H. G. Grimmeiss (*Annual Rev. of Matr. Sci.*, Vol. 7, Annual Reviews Inc., Palo Alto, CA., 1977). The optical absorption parameter can be defined as trap density, $T_0$, times the optical cross-section, $\sigma_o$.

In a recent article entitled "Semiconductor-Laser Self Pulsing Due to Deep Level Traps" by J. A. Copeland, *Electronics Letters*, vol. 14, No. 25, December 1978, pp. 809-810, I presented the equations which describe the dynamic behavior of the electron density, photon density, and empty trap density in a semiconductor laser in which deep-level traps are established in the active region of the laser. The term deep-level trap, as used herein, refers to a crystal imperfection, lattice defect or impurity situated in the active region of the laser and having the capacity to trap an electron. The electron held by this trap should exhibit an energy that is removed from both the conduction and valance bands by more than a few kT, where k is Boltzmann's constant and T is the temperature. Accordingly, these deep-level traps capture and hold electrons at energy levels that are approximately midway between the valance and conducton bands.

In my above-identified article, I described how sustained pulsations of output light are created in a semiconductor laser wherein the optical absorption parameter is greater than 6 cm$^{-1}$. The equations presented in that article are equally applicable to the operation of the laser to be described hereinbelow and therefore my above-identified article is incorporated herein by reference. As pointed out in the article, the traps during the time that they hold electrons act as absorbers for the photons that are present, thereby causing a low level of output light intensity between the optical pulses. It is only when the electron density builds up, partially by the fact that photons energize the electrons in the traps, that a peak in light intensity can be achieved. At this peak of light intensity, a substantial percentage of the traps are empty, and their electons have been energized into the conduction band thereby increasing the overall gain of the laser. At the light intensity peak the electron density begins decreasing, and more and more of the electrons are then utilized to refill the traps, thereby causing a rapid decrease in the optical intensity.

The present invention is based on my discovery that a III-V semiconductor laser whose active region has a trap density corresponding to an optical absorption parameter greater than 30 cm$^{-1}$ will exhibit a step function increase in output light intensity when the pump current exceeds a threshold level. This fact is exhibited in FIG. 1 wherein several graphs of computed output power versus pump current are shown. The ordinate in FIG. 1 corresponds to the output power that is available at one end of the semiconductor laser. Assuming a 50 percent distribution between each of the two ends and an approximate 40 percent efficiency, an overall parameter of approximately 20 percent is obtained to relate the total power in the cavity to the output power obtainable at one end of the cavity. Curves 101 through 104 correspond to the computed output power versus pump current for an aluminum gallium arsenide laser having different values of trap density in the active region. Inasmuch as the gain in an InGaAsP laser is approximately the same as the AlGaAs laser, the curves are also applicable to a laser with an InP active region. Curve 105 corresponds to the measured output power versus current for a sample whose active region has lattice dislocations that were created by proton bombardment.

Curve 101 in FIG. 1 corresponds to a laser having an optical absorption parameter equal to zero. This, of course, relates to a laser in which no deep-level traps are present in the active region. As shown in FIG. 1, a deep-level trap density must be created such that the optical absorption parameter $\alpha_o$ is greater than 30 cm$^{-1}$ before a significant step function increase in optical output power can be observed at the threshold current level. See, for example, curve 103 which corresponds to a trap density such that the optical absorption parameter is equal to 90 cm$^{-1}$. At this level of trap density, substantially zero optical output power is provided by the laser up to a current level of approximately 113 milliamperes. For pump currents in excess of this threshold level, the output optical power jumps to a level of approximately 1 milliwatt.

The deep-level traps can be created in the active region of a III-V semiconductor laser by bombarding the active region with protons during the construction of the semiconductor laser. To establish an optical absorption parameter of 180 cm$^{-1}$ in the active region of an aluminum gallium arsenide laser, the active region can be bombarded with protons having a density of 3.0 $\times 10^{14}$ cm$^{-2}$ and using 150 kilovolts of accelerating potential. Lattice defects created in this way in GaAs have an optical cross-section of approximately $10^{-16}$ cm$^2$. Hence, the lattice defect density to obtain 180 cm$^{-1}$ would be approximately 1.8 $\times 10^{18}$ cm$^{-3}$.

Other levels of trap density may be created in the active region by using other proton densities. For guidance, see the article "Electrical Measurement of the Lateral Spread of the Proton Isolation Layer in GaAs" by H. Matsumura and K. G. Stephens, *Journal of Applied Physics*, Vol. 48, No. 7 , July 1977, pp. 2779-2783.

Deep-level electron traps may also be created in the active region of a III-V semiconductor laser by doping the region with dopants such as chromium, oxygen or iron. For guidance in achieving different values of dopant densities, see the article entitled "Preparation and Properties of Semi-Insulating Liquid Phase Epitaxial Gallium Arsenide for Application to FET Devices" by Y. Houng, Technical Report No. 5125-1, Solid-State Electronics Laboratory, Stanford University, January 1977.

The optical absorption parameter created in the active region layer either by ion bombardment or by the addition of dopants can be measured by using the technique set forth in the article "Threshold Behavior of (GaAl) As-GaAs Lasers at Low Temperatures", by C. J. Hwang, *Journal of Applied Physics*, January 1978, pp. 29-34.

If a trap-doped laser of the type represented by curve 104 in FIG. 1 is biased just below the threshold current $I_t$ at a current $I_b$ and then pulses to a value $I_p$ just above threshold for a short period, it will emit a light pulse containing about $2 \times 10^8$ photons. Calculations show that if $I_b$ were exactly at threshold a 1 milliampere current pulse would have to be approximately 1 nanosecond long in order to trigger the light pulse. This trigger pulse would contain only $6 \times 10^6$ electrons, which means there is an electron-to- photon conversion gain for the laser in excess of 30. A shorter current pulse containing the same charge would be even more effective for triggering. Accordingly, if this trigger pulse were obtained from an efficient normal photodiode for which efficiencies of approximately 20 percent are obtainable, the photodiode could be caused to trigger the laser even with some energy loss between them and an overall optical gain can be achieved.

An additional advantage of a trap-doped triggerable laser (TDTL) of the type described hereinabove with an active region having an optical absorption parameter greater than 30 cm$^{-1}$ is that the pulses emitted are uniform in amplitude and duration and are independent of the shape of the input pulse. In addition, each pulse emitted is very short in duration (less then 1 nanosecond). Hence, a TDTL can be utilized to create a 1 Gbit/sec optical system with low duty cycle pusles. The uniform duration of the output pulse even permits the use of a repeater that does not require the usual complicated circuits needed to retime the output pulse.

Figure 2:
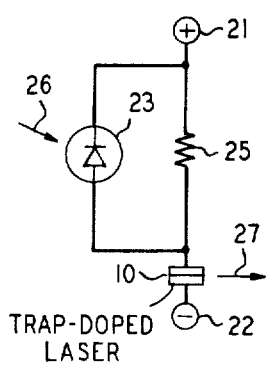
FIGS. 2, 3, 4 and 5 are schematic diagrams of circuits which utilize the present invention.

An arrangement of elements which utilizes the present invention is shown in FIG. 2 of the drawings. A potential source between terminals 21 and 22 provides a bias current to trap-doped laser 10 through a resistor 25. The potential developed across resistor 25 is connected to photodiode 23 which is polled in a manner such that the voltage drop across the resistor backbiases the photodiode. The two parameters consisting of the resistance value and the potential value of the source are chosen so as to develop both a proper backbias potential across the photodiode 23 and to develop a bias current slightly below the threshold current for trap-doped laser 10. With the arrangement of elements in FIG. 2, a photon pulse 26 can be directed onto photodiode 23 thereby causing a light pulse 27 to be emitted from trap-doped laser 10. As pointed out hereinabove, the light pulse 27 will have a larger number of photons and therefore more energy than light pulse 26. Hence, the elements of FIG. 2 provide optical gain.

Figure 3:
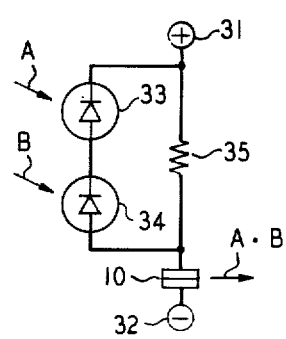

In FIG. 3, biasing current for a trap-doped laser 10 is also provided by a potential source through a resistor 35. In this case, however, two series connected photodiodes 33 and 34 are connected in parallel with resistor 35 and polled so as to be backbiased by the potential drop across resistor 35. In this circuit of FIG. 3, a light pulse must impinge upon both of the photodiodes 33 and 34 before a pulse is emitted by laser 10. Hence, the circuit of FIG. 3 operates as an optical AND gate. Since the trap-doped laser has a significant gain, the diodes can be normal photodiodes and the potential required to backbias these diodes is of a reasonable value in the order of a few volts, as compared with avalanche photodiodes which require high biasing potentials.

Figure 4:
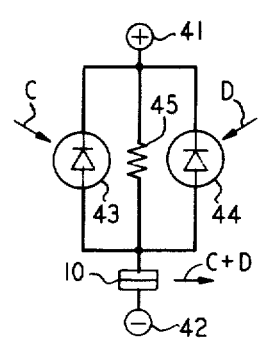

In FIG. 4, a trap-doped laser 10 has its bias current provided by a potential source between terminals 41 and 42 through a resistor 45. In the circuit of FIG. 4, a photodiode 43 and a photodiode 44 are each connected in parallel with each other and in parallel with resistor 45. The diodes are again polled so as to be backbiased by the potential drop across the resistor. In this circuit of FIG. 4, a light pulse impinging upon either one of the photodiodes 43 or 44 can provide a current pulse that is sufficient to cause trap-doped laser 10 to emit a light pulse. Here again, the output light pulse has greater energy than the light pulse required to trigger the laser and, therefore, optical gain is achieved. In addition, the circuit of FIG. 4 provides an optical logic gate that exhibits the OR function.

Figure 5:
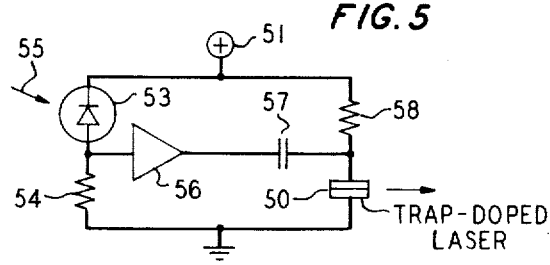

As pointed out hereinabove, the pulse developed by a trap-doped triggerable laser is uniform in amplitude and duration and is independent of the shape of the input electrical pulse. This fact is a sufficient justification for using a trap-doped laser in place of a prior art heterostructure semiconductor laser, even when the laser is to be combined wih an avalanche photodiode or with an ordinary photodiode and an electronic signal amplifier. A combination of the latter type is shown in FIG. 5 wherein an input light pulse 55 is coupled so as to impinge on the active region of a photodiode 53. The current provided to diode 53 from a potential source 51 through resistor 54 is sufficient to backbias the photodiode at its operating potential. The electrical pulse provided by photodiode 53 in response to the optical pulse 55 is coupled to the input of an electronic signal amplifier 56 whose output is coupled through a dc blocking capacitor 57 to trap-doped laser 50. Laser 50 is forward biased by a current provided from potential source 51 through a resistor 58, the value of which is selected to provide a bias current having a value slightly below the threshold current value illustrated in FIG. 1. The combination of elements shown in FIG. 5 provides a complete optical repeater which does not require the usual complicated circuits needed to retime the output pulse. In addition, this arrangement of FIG. 5, although more complicated than the configuration of elements shown in FIG. 2, does provide a repeater with increased sensitivity and therefore more loss can be permitted to occur between repeaters.

What has been described hereinabove is merely an illustrative embodiment of the present invention. Numerous departures may be made by those skilled in the art without departing from the spirit and scope of the present invention. For example, although the elements have been shown as discrete elements in the schematic diagrams, it should be readily apparent to those skilled in the art that the photodiodes and trap-doped lasers may be constructed as elements in a single, integrated circuit. Such a construction would easily permit the cascading of several type circuits in order to achieve more complicated logic functions.

I claim:

1. In a heterostructure semiconductor laser having its material elements selected from the group consisting of indium, gallium, aluminum, arsenic and phosphorus, an active region layer for generating an output optical pulse in response to an electrical pulse that exceeds a predetermined threshold level,
characterized in that
said active region layer includes deep-level electron traps having a concentration density such that the optical absorption parameter corresponding to said electron traps in said active region exceeds 30 $cm^{-1}$, said electron traps being defects in the crystal lattice of the active region layer that have been created by ion bombarding said active region layer.

2. In a heterostructure semiconductor laser having its material elements selected from the group consisting of indium, gallium, aluminum, arsenic and phosphorus, an active region layer for generating an output optical pulse in response to an electrical pulse that exceeds a predetermined threshold level,
characterized in that
said active region layer includes deep-level electron traps having a concentration density such that the optical absorption parameter corresponding to said electron traps in said active region exceeds 30 $cm^{-1}$, said electron traps being provided by at least one impurity in said active region layer, the impurity being selected from the group of elements consisting of oxygen, iron and chromium.

3. In combination, photodetector means for generating an electrical pulse in response to an input optical pulse, and a heterostructure semiconductor laser having its material elements selected from the group consisting of indium, gallium, aluminum, arsenic and phosphorus and having an active region layer for generating an output optical pulse in response to said electrical pulse,
said active region layer includes deep-level electron traps having a concentration density such that the optical absorption parameter corresponding to said electron traps in said active region exceeds 30 $cm^{-1}$.

4. The combination as defined in claim 3 wherein said photodetector means includes a resistor connected in series with said semiconductor laser, and a photodiode connected in parallel with said resistor.

5. The combination as defined in claim 3 wherein said photodetector means includes a resistor connected in series with said semiconductor laser, and at least two photodiodes are connected in series with each other, the series combination being connected in parallel with said resistor.

6. The combination as defined in claim 4 wherein said photodetector means includes at least a second photodetector in parallel with said resistor.

7. The combination as defined in claim 3 wherein the electron traps in the active region layer are defects in the crystal lattice such as vacancies or interstitial atoms.

8. The combination as defined in claim 3 wherein the electron traps of the active region layer are due to the presence of at least one impurity that has been added as a dopant to the active region layer, the impurity being selected from the group of elements consisting of oxygen, iron and chromium.

* * * * *